(12) United States Patent
Yoon et al.

(10) Patent No.: US 9,754,533 B2
(45) Date of Patent: Sep. 5, 2017

(54) ORGANIC LIGHT-EMITTING DISPLAY APPARATUS

(71) Applicant: Samsung Display Co., Ltd., Yongin, Gyeonggi-Do (KR)

(72) Inventors: Juwon Yoon, Yongin (KR); Iljeong Lee, Yongin (KR); Jiseon Lee, Yongin (KR); Choongyoul Im, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 217 days.

(21) Appl. No.: 14/674,707

(22) Filed: Mar. 31, 2015

(65) Prior Publication Data

US 2016/0078809 A1 Mar. 17, 2016

(30) Foreign Application Priority Data

Sep. 16, 2014 (KR) ........................ 10-2014-0122926

(51) Int. Cl.
*G09G 3/3233* (2016.01)
*H01L 27/32* (2006.01)

(52) U.S. Cl.
CPC ....... *G09G 3/3233* (2013.01); *H01L 27/3262* (2013.01); *G09G 2300/0819* (2013.01);
(Continued)

(58) Field of Classification Search
CPC .......... G09G 3/3241; G09G 2300/0819; H01L 27/3262; H01L 27/3265; H01L 27/3276
(Continued)

(56) References Cited

U.S. PATENT DOCUMENTS

2006/0290633 A1* 12/2006 Choi ................... H01L 27/12
345/92
2007/0241336 A1* 10/2007 Tokioka ............ H01L 29/78645
257/72
(Continued)

FOREIGN PATENT DOCUMENTS

KR 1020050039168 A 4/2005
KR 1020120008360 A 1/2012
(Continued)

*Primary Examiner* — Whitney T Moore
*Assistant Examiner* — Herve Assouman
(74) *Attorney, Agent, or Firm* — Robert E. Bushnell, Esq.

(57) ABSTRACT

An organic light-emitting display apparatus is provided. The apparatus includes an organic light-emitting diode emitting visible light, a driving thin film transistor driving the organic light-emitting diode, and a compensation thin film transistor. The compensation thin film transistor includes a compensation gate electrode, a compensation semiconductor layer, a compensation source electrode, and a compensation drain electrode. The compensation gate electrode includes a first gate electrode, and a second gate electrode electrically connected to the first gate electrode. The compensation drain electrode is electrically connected to the driving gate electrode of the driving thin film transistor. The compensation semiconductor layer includes a first semiconductor region overlapping the first gate electrode and a second semiconductor region overlapping the second gate electrode and disposed further from the compensation drain electrode than the first semiconductor region, and an area of the first semiconductor region is less than that of the second semiconductor region.

18 Claims, 6 Drawing Sheets

(52) U.S. Cl.
CPC .............. *G09G 2300/0861* (2013.01); *G09G 2310/0251* (2013.01); *G09G 2310/0262* (2013.01); *H01L 27/3265* (2013.01); *H01L 27/3276* (2013.01)

(58) Field of Classification Search
USPC .......................................................... 257/72
See application file for complete search history.

(56) References Cited

U.S. PATENT DOCUMENTS

| | | | |
|---|---|---|---|
| 2012/0015181 A1 | 1/2012 | Seo et al. | |
| 2013/0126873 A1* | 5/2013 | Yang | H01L 29/78648 257/59 |
| 2013/0257839 A1* | 10/2013 | Hyeon | G06F 3/038 345/212 |

FOREIGN PATENT DOCUMENTS

| | | |
|---|---|---|
| KR | 1020120074422 A | 7/2012 |
| KR | 1020130019119 A | 2/2013 |
| KR | 1020130055261 A | 5/2013 |

* cited by examiner

ORGANIC LIGHT-EMITTING DISPLAY APPARATUS

CLAIM OF PRIORITY

This application claims the benefit of Korean Patent Application No. 10-2014-0122926, filed on Sep. 16, 2014, in the Korean Intellectual Property Office, the disclosure of which is incorporated herein in its entirety by reference.

BACKGROUND OF THE INVENTION

Field of the Invention

One or more exemplary embodiments relate to an organic light-emitting display apparatus.

Description of the Related Art

Organic light-emitting display apparatuses display images by using organic light-emitting diodes in which light is generated by recombination of electrons and holes. Organic light-emitting display apparatuses have advantages of fast response times and low electric power consumption.

An organic light-emitting display apparatus (for example, an active matrix-type organic light-emitting display apparatus) generally includes a plurality of gate lines, a plurality of source lines, a plurality of power lines, and a plurality of pixels connected to the pluralities of gate, source, and power lines and arranged in a matrix shape. In order to drive each of the plurality of pixels, the pluralities of gate, source, and power lines transmit various signals to each of the pixels.

Meanwhile, for high resolution output, as each of the pixels becomes smaller, width of the lines connected to the pixels decreases and distance between the lines decreases, and thus it becomes difficult to drive the plurality of pixels uniformly. Accordingly, the extent to which picture quality of the organic light-emitting display apparatus may be improved is limited.

SUMMARY OF THE INVENTION

One or more exemplary embodiments include an organic light-emitting display apparatus having improved picture quality properties.

Additional aspects will be set forth in part in the description which follows and, in part, will be apparent from the description, or may be learned by practice of the presented embodiments.

According to one or more exemplary embodiments, an organic light-emitting display apparatus includes an organic light-emitting diode emitting visible light, a driving thin film transistor driving the organic light-emitting diode and including a driving gate electrode, a driving semiconductor layer, a driving source electrode, and a driving drain electrode, and a compensation thin film transistor electrically connected to the driving thin film transistor and compensating for threshold voltage of the driving thin film transistor. The compensation thin film transistor includes a compensation gate electrode, a compensation semiconductor layer, a compensation source electrode, and a compensation drain electrode. The compensation gate electrode includes a first gate electrode, and a second gate electrode electrically connected to the first gate electrode. The compensation drain electrode is electrically connected to the driving gate electrode of the driving thin film transistor. The compensation semiconductor layer includes a first semiconductor region overlapping the first gate electrode and a second semiconductor region overlapping the second gate electrode and disposed further from the compensation drain electrode than the first semiconductor region, and an area of the first semiconductor region is less than that of the second semiconductor region.

A length of the first semiconductor region in a direction from the compensation source electrode to the compensation drain electrode may be less than a length of the second semiconductor region in a direction from the compensation source electrode to the compensation drain electrode.

A width of the first semiconductor region in a direction perpendicular to a direction of the compensation source electrode toward the compensation drain electrode may be less than a width of the second semiconductor region in a direction perpendicular to a direction of the compensation source electrode toward the compensation drain electrode.

The first gate electrode of the compensation gate electrode may correspond to a region of a wire, and the second gate electrode may protrude from the wire.

An area of the first gate electrode that overlaps the first semiconductor region and corresponds to a length in a direction from the compensation source electrode to the compensation drain electrode may have a smaller width than an area of the second gate electrode that overlaps the second semiconductor region and corresponds to a length in a direction from the compensation source electrode to the compensation drain electrode.

A wire to which the first gate electrode of the compensation gate electrode corresponds may be a scanning line via which a scan signal for driving the organic light-emitting diode is applied.

The apparatus may further include a switching thin film transistor connected to the scanning line and including a switching gate electrode, a switching semiconductor layer, a switching source electrode, and a switching drain electrode.

The compensation semiconductor layer may be curved such that the first semiconductor region and the second semiconductor region may not be disposed side by side.

The apparatus may further include a first conductive member electrically connecting the driving gate electrode and the compensation drain electrode, wherein the first conductive member may extend so as to be disposed in a first contact hole which corresponds to the driving gate electrode and in a second contact hole which corresponds to the compensation drain electrode.

The apparatus may further include a storage capacitor which includes a first electrode electrically connected to the compensation drain electrode and a second electrode connected to a driving voltage line.

The first electrode of the storage capacitor may be connected to the driving gate electrode.

The second electrode may include an opening formed in a region where the second electrode at least overlaps the first electrode.

The second electrode may be at least commonly included in at least two adjacent pixels selected from among the pixels.

The driving voltage line may be connected to the second electrode.

The compensation source electrode may be electrically connected to the driving drain electrode.

The apparatus may further include an emission control thin film transistor operating according to an emission control signal transmitted through an emission control line, wherein the compensation source electrode may be electrically connected to a pixel electrode of the organic light-emitting diode via the emission control thin film transistor.

The apparatus may further include an emission control thin film transistor operating according to an emission control signal transmitted through an emission control line, wherein the driving source electrode may be electrically connected to a driving voltage line via the emission control thin film transistor.

The compensation source electrode and the compensation drain electrode may be formed by doping the compensation semiconductor layer with impurities.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
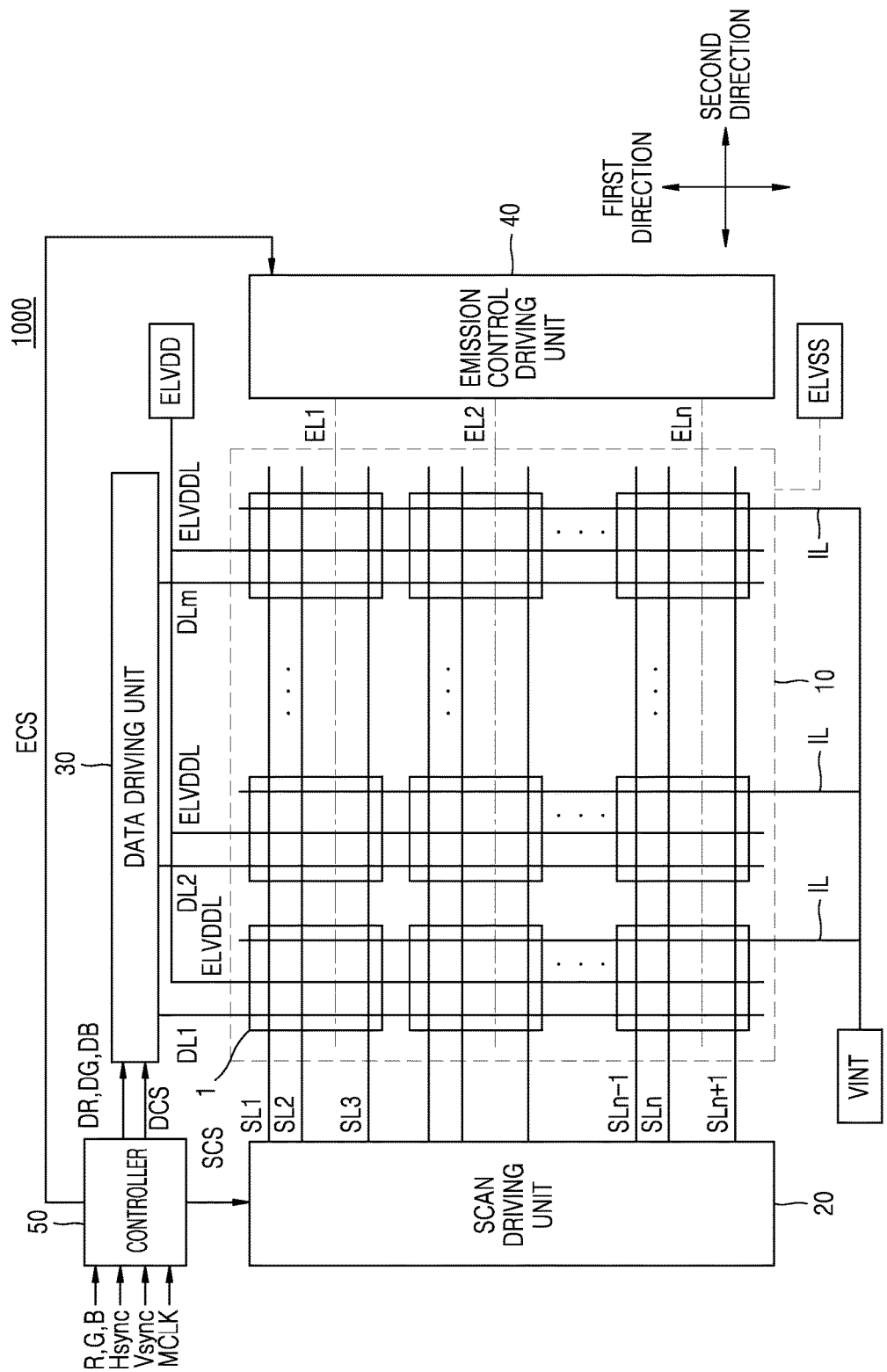
FIG. 1 is a schematic block diagram of an organic light-emitting display apparatus according to an embodiment.

As the inventive concept allows for various changes and numerous embodiments, exemplary embodiments will be illustrated in the drawings and described in detail in the written description. The effect and feature of the inventive concept and methods of accomplishing the same will become apparent from the following description of the embodiments in detail, taken in conjunction with the accompanying drawings. This inventive concept may, however, be embodied in many different forms and should not be construed as limited to the exemplary embodiments set forth herein.

Expressions such as "at least one of," when preceding a list of elements, modify the entire list of elements and do not modify the individual elements of the list.

While such terms as "first" and "second" may be used to describe various components, such components must not be limited to the above terms. The above terms are used only to distinguish one component from another.

As used herein, the singular forms "a," "an," and "the" are intended to include the plural forms as well, unless the context clearly indicates otherwise.

It will be understood that the terms such as "include," "comprise," and "have" used herein specify the presence of stated features or components, but do not preclude the presence or addition of one or more other features or components.

It will be further understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When an embodiment may be implemented differently, a specific process order may be performed differently from the described order. For example, two consecutively described processes may be performed substantially at the same time or performed in an order opposite to the described order.

Hereinafter, the inventive concept will be described in detail with reference to the accompanying drawings, in which exemplary embodiments of the invention are shown. Like reference numerals in the drawings denote like elements, and thus repeated descriptions thereof will be omitted.

FIG. 1 is a schematic block diagram of an organic light-emitting display apparatus 1000 according to an embodiment.

The organic light-emitting display apparatus 1000 according to the present embodiment may include a display 10 including a plurality of pixels 1, a scan driving unit 20, a data driving unit 30, an emission control driving unit 40, and a controller 50.

In some embodiments, the emission control driving unit 40 may be omitted.

The display 10, disposed at the intersection of a plurality of scanning lines SL1 through SLn+1, a plurality of data lines DL1 through DLm and a plurality of emission control lines EL1 through ELn, includes the plurality of pixels 1 arranged substantially in a matrix shape. The plurality of scanning lines SL1 through SLn+1 and the plurality of emission control lines EL1 through ELn are extended in a second direction, which is a row direction of FIG. 1. The plurality of data lines DL1 through DLm and a driving voltage line ELVDDL are extended in a first direction, which is a column direction of FIG. 1. In one pixel line, n values of the plurality of scanning lines SL1 through SLn+1 may be different from those of the plurality of emission control lines EL1 through ELn.

As described above, if the emission control driving unit 40 is omitted, the plurality of emission control lines EL1 through ELn may be omitted.

Each of the pixels 1 may be connected to three of the plurality of scanning lines SL1 through SLn+1 delivered to the display 10. In some embodiments, each of the pixels 1 may be connected to one or two of the plurality of scanning lines SL1 through SLn+1.

The scan driving unit 20 may generate and transmit three scan signals to each of the pixels 1 through the plurality of scanning lines SL1 through SLn+1. That is, the scan driving unit 20 sequentially supplies the scan signals to each of the pixels 1 through a first scanning line SL2 through SLn, a second scanning line SL1 through SLn−1, or a third scanning line SL3 through SLn+1. An initialization voltage of the display 10 may be applied to an initialization voltage line IL through a power supply source VINT.

Also, each of the pixels 1 may be connected to one of the plurality of data lines DL1 through DLm connected to the display 10 and one of the plurality of emission control lines EL1 through ELn connected to the display 10.

The data driving unit 30 transmits a data signal to each of the pixels 1 through the plurality of data lines DL1 through DLm. Whenever the scan signal is supplied to each of the pixels 1 through the first scanning line SL2 through SLn, the data signal is supplied to each of the pixels 1 selected by the scan signal.

The emission control driving unit 40 generates and transmits an emission control signal to each of the pixels 1 through the plurality of emission control lines EL1 through ELn. The emission control signal controls a light-emitting time of the pixel 1. As described above, in some embodiments, the emission control driving unit 40 may be omitted.

The controller 50 converts a plurality of image signals R, G, and B transmitted from the outside into a plurality of image data signals DR, DG, and DB, and transmits the plurality of image data signals DR, DG, and DB to the data driving unit 30. Also, as a vertical synchronizing signal Vsync, a horizontal synchronizing signal Hsync and a clock signal MCLK are transmitted to the controller 50, the controller 50 respectively generates and transmits control signals for controlling drives of the scan driving unit 20, the data driving unit 30 and the emission control driving unit 40 to the scan driving unit 20, the data driving unit 30 and the emission control driving unit 40. That is, the controller 50 respectively generates and transmits a scan driving control signal SCS for controlling the scan driving unit 20, a data driving control signal DCS for controlling the data driving unit 30, and an emission driving control signal ECS for controlling the emission control driving unit 40 to the corresponding driving units 20, 30, and 40.

A first power voltage ELVDD and a second power voltage ELVSS from the outside are supplied to each of the pixels 1. The first power voltage ELVDD may be a predetermined high-level voltage, and the second power voltage ELVSS may be a voltage lower than the first power voltage ELVDD or a ground voltage. The first power voltage ELVDD is supplied to each of the pixels 1 through the driving voltage line ELVDDL.

Each of the pixels 1 emits light of predetermined brightness by a driving current which is supplied to a light-emitting diode according to the data signal transmitted through the plurality of data lines DL1 through DLm.

Figure 2:
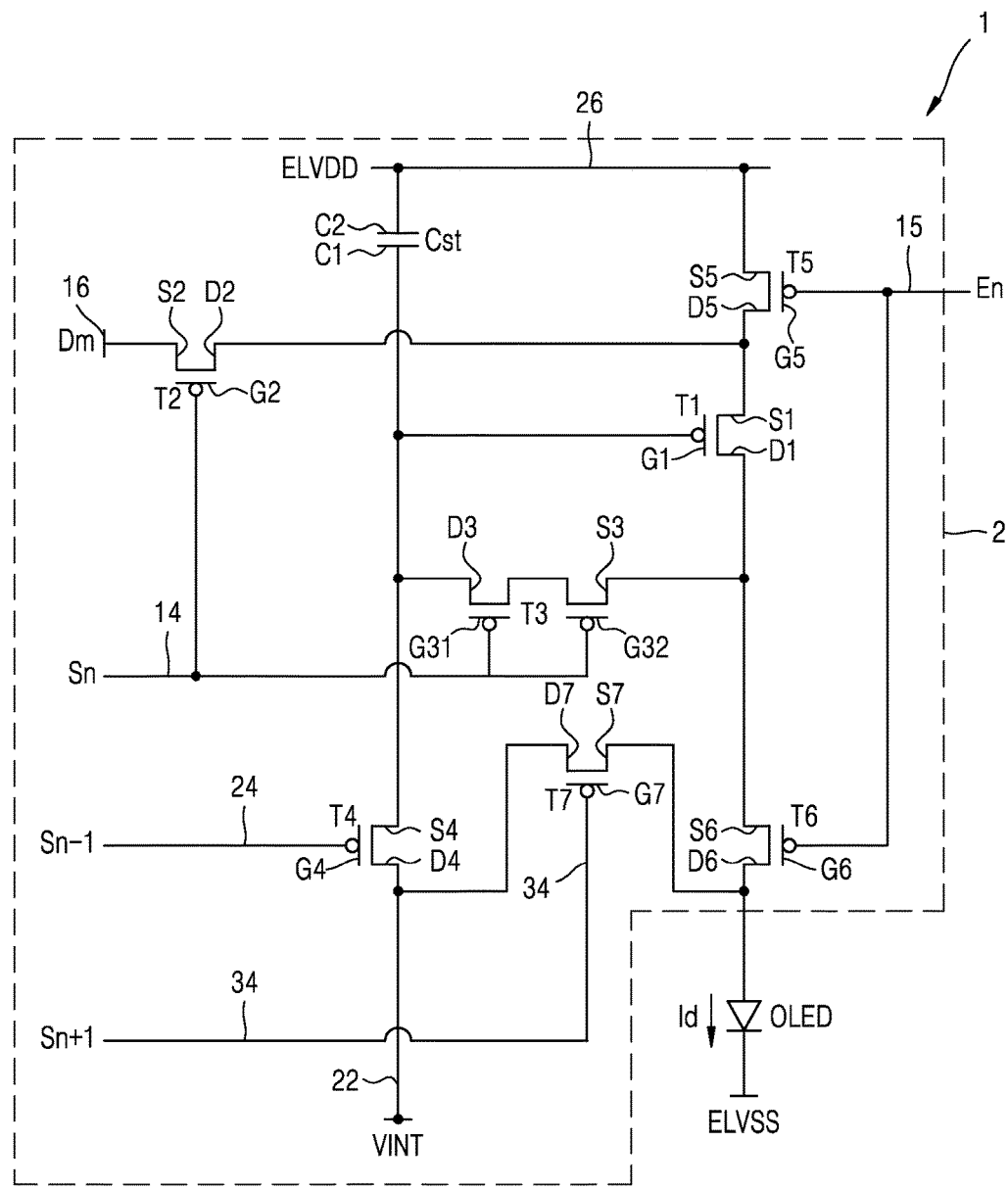
FIG. 2 is an equivalent circuit diagram of one pixel of the organic light-emitting display apparatus according to the present embodiment.

FIG. 2 is an equivalent circuit diagram of one pixel 1 of the organic light-emitting display apparatus 1000 according to the present embodiment.

The pixel 1 of the organic light-emitting display apparatus 1000 according to the present embodiment may include a pixel circuit 2 including a plurality of thin film transistors T1 through T7 and at least one storage capacitor Cst. The pixel 1 also includes an organic light-emitting diode OLED emitting light by the driving current supplied through the pixel circuit 2.

The plurality of thin film transistors T1 through T7 may include a driving thin film transistor T1, a switching thin film transistor T2, a compensation thin film transistor T3, a first initialization thin film transistor T4, a first emission control thin film transistor T5, a second emission control thin film transistor T6, and a second initialization thin film transistor T7.

In some embodiments, at least one of the first initialization thin film transistor T4, the first emission control thin film transistor T5, the second emission control thin film transistor T6, and the second initialization thin film transistor T7 may be omitted among the plurality of thin film transistors T1 through T7.

The pixel 1 may include a first scanning line 14 transmitting a first scan signal Sn to the switching thin film transistor T2 and the compensation thin film transistor T3, a second scanning line 24 transmitting a second scan signal Sn−1 to the first initialization thin film transistor T4, a third scanning line 34 transmitting a third scan signal Sn+1 to the second initialization thin film transistor T7, an emission control line 15 transmitting an emission control signal En to the first emission control thin film transistor T5 and the second emission control thin film transistor T6, a data line 16 transmitting a data signal Dm, a driving voltage line 26 transmitting the first power voltage ELVDD, and an initialization voltage line 22 transmitting an initialization voltage from power supply source VINT for initializing the driving thin film transistor T1.

As described above, if at least one of the first initialization thin film transistor T4, the first emission control thin film transistor T5, the second emission control thin film transistor T6, and the second initialization thin film transistor T7 is omitted, at least one of the second scanning line 24, the third scanning line 34, and the emission control line 15 corresponding to the omitted thin film transistor may be omitted.

A driving gate electrode G1 of the driving thin film transistor T1 is connected to a first electrode C1 of the storage capacitor Cst. A driving source electrode S1 of the driving thin film transistor T1 may be connected to the driving voltage line 26 via the first emission control thin film transistor T5. A driving drain electrode D1 of the driving thin film transistor T1 is electrically connected to a pixel electrode of the organic light-emitting diode OLED via the second emission control thin film transistor T6. As the data signal Dm is transmitted to the driving thin film transistor T1 according to switching operations of the switching thin film transistor T2, the driving thin film transistor T1 supplies a driving current Id to the organic light-emitting diode OLED.

A switching gate electrode G2 of the switching thin film transistor T2 is connected to the first scanning line 14. A switching source electrode S2 of the switching thin film transistor T2 is connected to the data line 16. A switching drain electrode D2 of the switching thin film transistor T2 is connected to the driving source electrode S1 of the driving thin film transistor T1 and is also connected to the driving voltage line 26 via the first emission control thin film transistor T5. As the switching thin film transistor T2 is turned on according to the first scan signal Sn transmitted through the first scanning line 14, the switching thin film transistor T2 may perform the switching operation of transmitting the data signal Dm transmitted through the data line 16 to the driving source electrode S1 of the driving thin film transistor T1.

Compensation gate electrodes G31 and G32 of the compensation thin film transistor T3 are connected to the first scanning line 14. A compensation source electrode S3 of the compensation thin film transistor T3 may be connected to the driving drain electrode D1 of the driving thin film transistor T1.

In some embodiments, the compensation source electrode S3 of the compensation thin film transistor T3 may be electrically connected to the pixel electrode of the organic light-emitting diode OLED via the second emission control thin film transistor T6.

A compensation drain electrode D3 of the compensation thin film transistor T3 is electrically connected to the driving gate electrode G1 of the driving thin film transistor T1.

Also, the compensation drain electrode D3 may be electrically connected to the first electrode C1 of the storage capacitor Cst.

In some embodiments, the compensation drain electrode D3 may be electrically connected to a first initialization source electrode S4 of the first initialization thin film transistor T4.

As the compensation thin film transistor T3 is turned on according to the first scan signal Sn transmitted through the first scanning line 14, the compensation thin film transistor T3 may have the driving thin film transistor T1 diode-connected by connecting the driving gate electrode G1 and the driving drain electrode D1 of the driving thin film transistor T1.

A first initialization gate electrode G4 of the first initialization thin film transistor T4 may be connected to the second scanning line 24. A first initialization drain electrode D4 of the first initialization thin film transistor T4 may be connected to the initialization voltage line 22. The first initialization source electrode S4 of the first initialization thin film transistor T4 may be connected to the first electrode C1 of the storage capacitor Cst, the compensation drain electrode D3 of the compensation thin film transistor T3, and the driving gate electrode G1 of the driving thin film transistor T1. As the first initialization thin film transistor T4 is turned on according to the second scan signal Sn−1 transmitted through the second scanning line 24, the first initialization thin film transistor T4 performs an initialization operation of initializing the driving gate electrode G1 of the driving thin film transistor T1 by transmitting the initialization voltage to the driving gate electrode G1 of the driving thin film transistor T1.

A first emission control gate electrode G5 of the first emission control thin film transistor T5 may be connected to the emission control line 15. A first emission control source electrode S5 of the first emission control thin film transistor T5 may be connected to the driving voltage line 26. A first emission control drain electrode D5 of the first emission control thin film transistor T5 may be connected to the driving source electrode S1 of the driving thin film transistor T1 and the switching drain electrode D2 of the switching thin film transistor T2.

A second emission control gate electrode G6 of the second emission control thin film transistor T6 may be connected to the emission control line 15. A second emission control source electrode S6 of the second emission control thin film transistor T6 may be connected to the driving drain electrode D1 of the driving thin film transistor T1 and the compensation source electrode S3 of the compensation thin film transistor T3. A second emission control drain electrode D6 of the second emission control thin film transistor T6 may be electrically connected to the pixel electrode of the organic light-emitting diode OLED. As the first emission control thin film transistor T5 and the second emission control thin film transistor T6 are simultaneously turned on according to the emission control signal En transmitted through the emission control line 15, the first power voltage ELVDD is transmitted to the organic light-emitting diode OLED so that the driving current Id flows in the organic light-emitting diode OLED.

A second initialization gate electrode G7 of the second initialization thin film transistor T7 may be connected to the third scanning line 34. A second initialization source electrode S7 of the second initialization thin film transistor T7 may be connected to the pixel electrode of the organic light-emitting diode OLED. A second initialization drain electrode D7 of the second initialization thin film transistor T7 may be connected to the initialization voltage line 22. As the second initialization thin film transistor T7 is turned on according to the third scan signal Sn+1 transmitted through the third scanning line 34, the second initialization thin film transistor T7 initializes the pixel electrode of the organic light-emitting diode OLED.

A second electrode C2 of the storage capacitor Cst may be connected to the driving voltage line 26. The first electrode C1 of the storage capacitor Cst may be connected to the driving gate electrode G1 of the driving thin film transistor T1, the compensation drain electrode D3 of the compensation thin film transistor T3, and the first initialization source electrode S4 of the first initialization thin film transistor T4.

An opposite electrode of the organic light-emitting diode OLED may be connected to the second power voltage ELVSS. As the driving current Id is supplied to the organic light-emitting diode OLED from the driving thin film transistor T1, the organic light-emitting diode OLED displays an image by emitting light.

Figure 3:
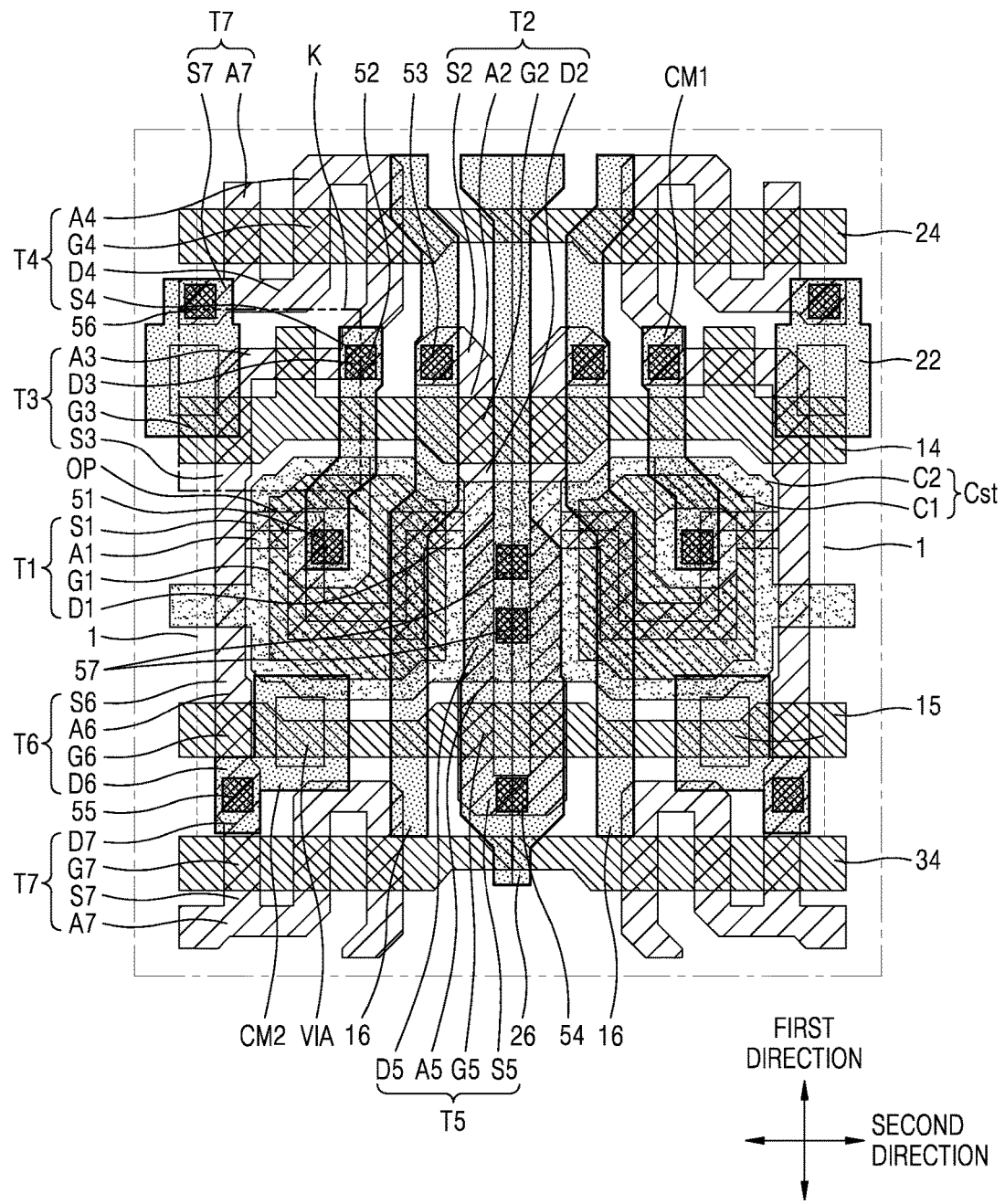
FIG. 3 is a schematic plan view of pixels of the organic light-emitting display apparatus according to the present embodiment.

FIG. 3 is a schematic plan view of the pixels 1 of the organic light-emitting display apparatus 1000 according to the present embodiment. Here, the two adjacent pixels 1 are illustrated for convenience of explanation.

Referring to FIG. 3, the driving thin film transistor T1, the switching thin film transistor T2, the compensation thin film transistor T3, the first initialization thin film transistor T4, the first emission control thin film transistor T5, the second emission control thin film transistor T6, the second initialization thin film transistor T7, and the storage capacitor Cst are formed in the pixel 1.

As described above, in some embodiments, at least one of the first initialization thin film transistor T4, the first emission control thin film transistor T5, the second emission control thin film transistor T6, and the second initialization thin film transistor T7 may be omitted. That is, all of the first initialization thin film transistor T4, the first emission control thin film transistor T5, the second emission control thin film transistor T6, and the second initialization thin film transistor T7 may be omitted.

For convenience of explanation, the organic light-emitting diode OLED is not illustrated in FIG. 3.

The driving thin film transistor T1 includes a driving semiconductor layer A1, the driving gate electrode G1, the driving source electrode S1, and the driving drain electrode D1. The driving source electrode S1 corresponds to a driving source region of the driving semiconductor layer A1 which is doped with impurities, and the driving drain electrode D1 corresponds to a driving drain region of the driving semiconductor layer A1 which is doped with impurities. The driving gate electrode G1 is connected to the first electrode C1 of the storage capacitor Cst, the compensation drain electrode D3 of the compensation thin film transistor T3, and the first initialization source electrode S4 of the first initialization thin film transistor T4. In more detail, the driving gate electrode G1 may be integrally formed on the same layer as the first electrode C1. The driving gate electrode G1 and the compensation drain electrode D3 may be electrically connected via a first conductive member CM1 provided in a first contact hole 51 and a second contact hole 52. That is, the first contact hole 51 is formed so as to correspond to the driving gate electrode G1, and the second contact hole 52 is formed so as to correspond to the compensation drain electrode D3. The first conductive member CM1 extends to be disposed in the first contact hole 51 and the second contact hole 52. Thus, the first conductive member CM1 comes into contact with the compensation drain electrode D3 at a position corresponding to the second contact hole 52, and with the driving gate electrode G1 at a position corresponding to the first contact hole 51.

Also, the driving gate electrode G1 and the first initialization source electrode S4 are electrically connected by the first conductive member CM1 disposed in the first contact hole 51 and the second contact hole 52.

The switching thin film transistor T2 includes a switching semiconductor layer A2, the switching gate electrode G2, the switching source electrode S2, and the switching drain electrode D2. The switching source electrode S2 corresponds to a switching source region of the switching semiconductor layer A2 which is doped with impurities, and the switching drain electrode D2 corresponds to a switching drain region of the switching semiconductor layer A2 which is doped with impurities. The switching source electrode S2 is connected to the data line 16 via a third contact hole 53. The switching drain electrode D2 may be connected to the driving thin film transistor T1 and the first emission control thin film transistor T5. The switching gate electrode G2 is integrally formed with the first scanning line 14.

The compensation thin film transistor T3 includes a compensation semiconductor layer A3, the compensation gate electrode G3, the compensation source electrode S3, and the compensation drain electrode D3. The compensation source electrode S3 corresponds to a compensation source region of the compensation semiconductor layer A3 which is doped with impurities, and the compensation drain electrode D3 corresponds to a compensation drain region of the compensation semiconductor layer A3 which is doped with impurities.

The compensation gate electrode G3 has a dual gate electrode formed by a portion of the first scanning line 14 and a portion of the wire protruding from the first scanning line 14, and thus prevents a leakage current.

Figure 4:
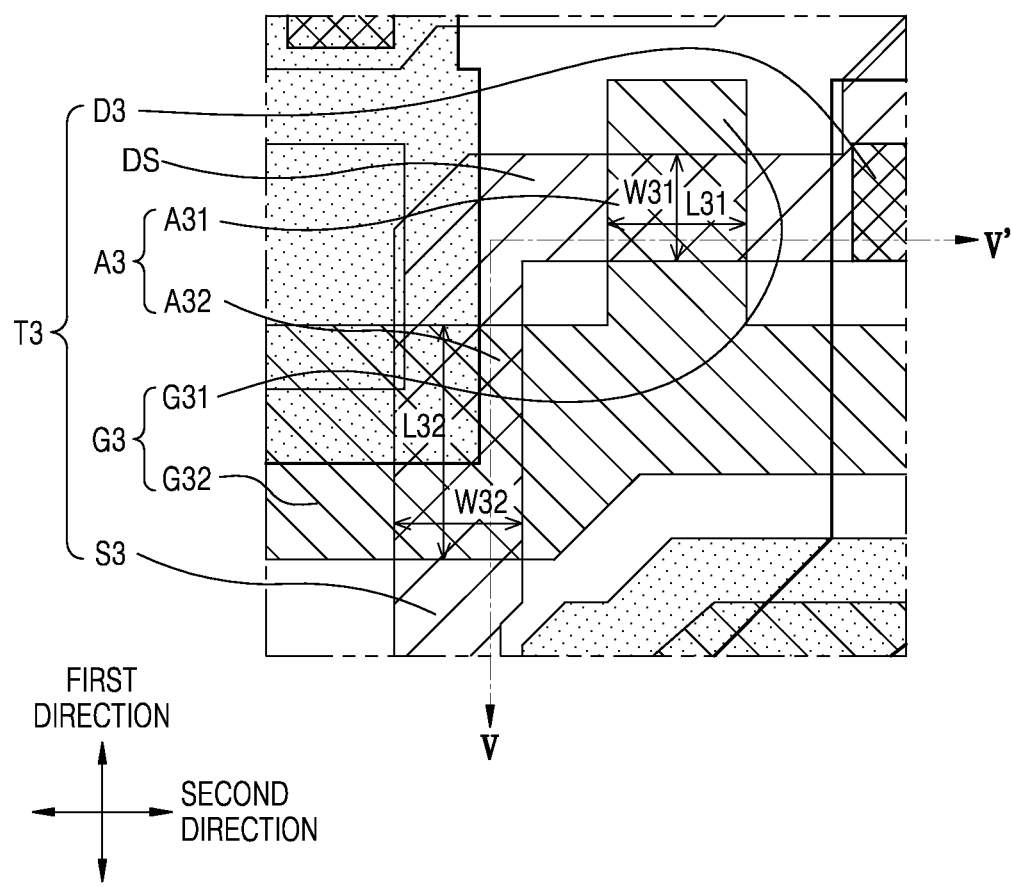
FIG. 4 is an enlarged view of K of FIG. 3.

FIG. 4 is an enlarged view of K of FIG. 3. Referring to FIG. 4, the compensation thin film transistor T3 has the dual gate electrode structure, whereby the compensation gate electrode G3 includes the first gate electrode G31 and the second gate electrode G32.

The first gate electrode G31, which is a region protruding from the first scanning line 14, is adjacent to the compensation drain electrode D3.

The second gate electrode G32, which is a region of the first scanning line 14, is adjacent to the compensation source electrode S3.

The compensation semiconductor layer A3 includes a first semiconductor region A31, at least a portion of which overlaps the first gate electrode G31, and a second semiconductor region A32, at least a portion of which overlaps the second gate electrode G32.

The first semiconductor region A31 and the second semiconductor region A32 may be a channel region of the compensation thin film transistor T3. The compensation thin film transistor T3 also includes a connection portion DS, which is doped with impurities, disposed between first semiconductor region A31 and the second semiconductor region A32. The connection portion DS electrically connects the first semiconductor region A31 and second semiconductor region A32 to each other.

In some embodiments, the first semiconductor region A31 and the second semiconductor region A32 are disposed not side by side to correspond to the first gate electrode G31 and the second gate electrode G32, respectively, but in a curved form, which facilitates forming the compensation thin film transistor T3 including the compensation semiconductor layer A3 in a small region.

The first semiconductor region A31 has a width W31 and a length L31. The width W31 and the length L31 are values corresponding to a size of the first semiconductor region A31 as a channel. That is, the length L31 is in a direction from the compensation source electrode S3 to the compensation drain electrode D3 via the connection portion DS. The width W31 is in a direction perpendicular to the length L31.

The second semiconductor region A32 has a width W32 and a length L32. The width W32 and the length L32 are values corresponding to a size of the second semiconductor region A32 as a channel. That is, the length L32 is in a direction from the compensation source electrode S3 to the compensation drain electrode D3 via the connection portion DS. The width W32 is in a direction perpendicular to the length L32.

An area of the first semiconductor region A31 is smaller than that of the second semiconductor region A32. That is, a product of the width W31 and the length L31 of the first semiconductor region A31 is less than that of the width W32 and the length L32 of the second semiconductor region A32.

In some embodiments, the width W31 of the first semiconductor region A31 is less than the width W32 of the second semiconductor region A32. Also, a width of the first gate electrode G31 is less than that of the second gate electrode G32.

In some embodiments, the length L31 of the first semiconductor region A31 is shorter than the length L32 of the second semiconductor region A32.

The compensation thin film transistor T3 transmits compensation voltage to the driving thin film transistor T1 so as to compensate for an occurrence of a deviation in threshold voltage of the driving thin film transistor T1.

A parasitic capacitance between the driving gate electrode G1 and the driving source electrode S1 of the driving thin film transistor T1, and the like may cause a voltage shift, that is, kickback voltage. In the case that the kickback voltage varies in different regions of the organic light-emitting display apparatus 1000, deviations in an image represented by the pixels 1 disposed in the different regions may occur.

According to the present embodiment, the first semiconductor region A31 adjacent to the compensation drain electrode D3 of the compensation thin film transistor T3 electrically connected to the driving gate electrode G1 of the driving thin film transistor T1 is formed smaller than the second semiconductor region A32. Thus, a deviation in kickback voltage in the driving thin film transistor T1 is reduced.

More details of this will be described with reference to FIGS. 6 and 7.

Turning back to FIG. 3, the first initialization thin film transistor T4 includes a first initialization semiconductor layer A4, the first initialization gate electrode G4, the first initialization source electrode S4, and the first initialization drain electrode D4. The first initialization source electrode S4 corresponds to a first initialization source region of the first initialization semiconductor layer A4 which is doped with impurities, and the first initialization drain electrode D4 corresponds to a first initialization drain region of the first initialization semiconductor layer A4 which is doped with impurities. The first initialization drain electrode D4 may be connected to the second initialization thin film transistor T7, and the first initialization source electrode S4 may be connected to the driving gate electrode G1 and the first electrode C1 of the storage capacitor Cst via the first conductive member CM1 provided in the first contact hole 51 and the second contact hole 52. The first initialization gate electrode G4 is formed as a portion of the second scanning line 24. The first initialization semiconductor layer A4 may overlap the first initialization gate electrode G4 two times.

The first emission control thin film transistor T5 includes a first emission control semiconductor layer A5, the first emission control gate electrode G5, the first emission control source electrode S5, and the first emission control drain electrode D5. The first emission control source electrode S5 corresponds to a first emission control source region of the first emission control semiconductor layer A5 which is doped with impurities, and the first emission control drain electrode D5 corresponds to a first emission control drain region of the first emission control semiconductor layer A5 which is doped with impurities. The first emission control source electrode S5 may be connected to the driving voltage line 26 via a fourth contact hole 54. The first emission control gate electrode G5 is formed as a portion of the emission control line 15.

The second emission control thin film transistor T6 includes a second emission control semiconductor layer A6, the second emission control gate electrode G6, the second emission control source electrode S6, and the second emission control drain electrode D6. The second emission control source electrode S6 corresponds to a second emission control source region of the second emission control semiconductor layer A6 which is doped with impurities, and the second emission control drain electrode D6 corresponds to a second emission control drain region of the second emission control semiconductor layer A6 which is doped with impurities. The second emission control drain electrode D6 is connected to the pixel electrode of the organic light-emitting diode OLED via a second conductive member CM2 connected to a fifth contact hole 55 and a via hole VIA connected to the second conductive member CM2. The second emission control gate electrode G6 is formed as a portion of the emission control line 15.

The second initialization thin film transistor T7 includes a second initialization semiconductor layer A7, the second initialization gate electrode G7, the second initialization source electrode S7, and the second initialization drain electrode D7. The second initialization source electrode S7 corresponds to a second initialization source region of the second initialization semiconductor layer A7 which is doped with impurities, and the second initialization drain electrode D7 corresponds to a second initialization drain region of the second initialization semiconductor layer A7 which is doped with impurities. The second initialization source electrode S7 may be connected to the initialization voltage line 22 via a sixth contact hole 56, and the second initialization drain electrode D7 is connected to the pixel electrode of the organic light-emitting diode OLED via the second conductive member CM2 connected to the fifth contact hole 55 and the via hole VIA connected to the second conductive member CM2. The second initialization gate electrode G7 is formed as a portion of the third scanning line 34.

The first electrode C1 of the storage capacitor Cst is directly connected to the driving gate electrode G1, and is connected to the first initialization thin film transistor T4 and the compensation thin film transistor T3 via the first conductive member CM1 provided in the first contact hole 51 and the second contact hole 52. The first electrode C1 may have a form of a floating electrode, and is disposed to overlap the driving semiconductor layer A1.

While the second electrode C2 of the storage capacitor Cst overlaps the first electrode C1, the second electrode C2 does not completely cover the first electrode C1. In some embodiments, the second electrode C2 may include an opening OP exposing a portion of the first electrode C1, and the first contact hole 51 is formed in the opening OP. The second electrodes C2 respectively included in the two adjacent pixels 1 may be connected to each other. The driving voltage line 26 may be connected to a central portion of the second electrode C2 commonly included in the two adjacent pixels 1 via a seventh contact hole 57 to transmit the driving voltage ELVDD simultaneously to the two pixels 1. That is, the driving voltage ELVDD is applied to the two adjacent pixels 1 from one driving voltage line 26 due to the second electrode C2 commonly included in the two pixels 1.

In some embodiments, the first scanning line 14, the second scanning line 24, the third scanning line 34, and the emission control line 15 may be all formed in the same layer and extend in the second direction. The first scanning line 14, the second scanning line 24, the third scanning line 34, and the emission control line 15 may be formed in the same layer as the first electrode C1 of the storage capacitor Cst.

The data line 16, the driving voltage line 26, and the initialization voltage line 22 may be all formed in the same layer and extend in the first direction.

In some embodiments, for example, the embodiment illustrate in FIG. 3, the two adjacent pixels 1 may share the driving voltage line 26. The driving voltage line 26 is disposed between the two adjacent pixels 1 and extends in the first direction. The driving voltage line 26 is connected to the first emission control thin film transistors T5 respectively included in the two adjacent pixels 1 via the fourth contact hole 54, and the second electrode C2 of the storage capacitor Cst commonly included in the two adjacent pixels 1 via the seventh contact hole 57. By sharing the driving voltage line 26, the two adjacent pixels 1 may be symmetric with respect to the driving voltage line 26. Thus, the number of the driving voltage lines 26 may be decreased, and design space may be easily secured as the number of wires decreases.

Figure 5:
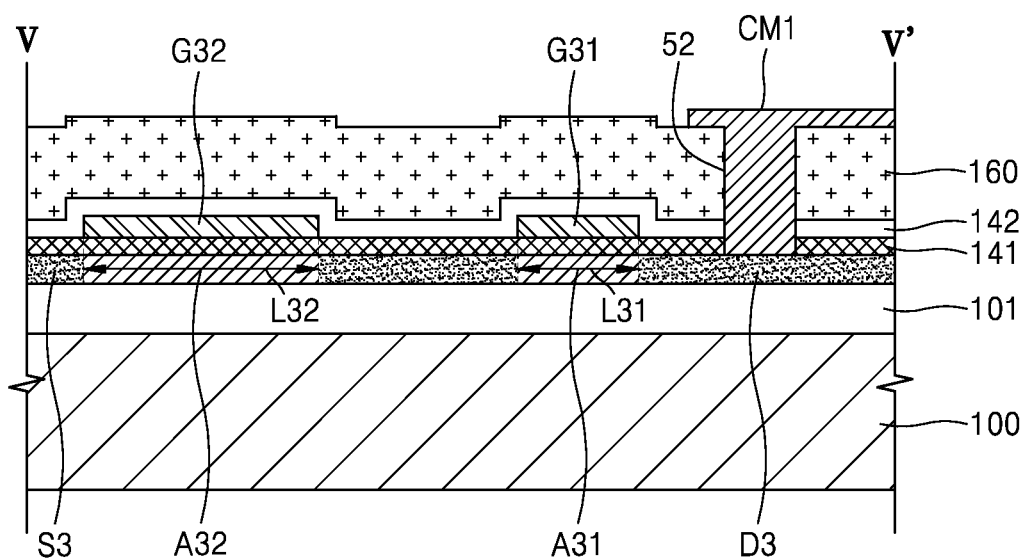
FIG. 5 is a cross-sectional view taken along line V-V' of FIG. 4.

FIG. 5 is a cross-sectional view taken along line V-V' of FIG. 4.

Referring to FIG. 5, the organic light-emitting display apparatus 1000 may include a substrate 100.

A buffer layer 101 is formed on the substrate 100. The substrate 100 may be formed of a glass material mainly including silicon dioxide ($SiO_2$). In some embodiments, the substrate 100 may be formed of a plastic material. In other embodiments, the substrate 100 may be formed of a metal thin film.

The buffer layer 101, which prevents an impure element from penetrating through the substrate 100 and provides a planar surface to an upper portion of the substrate 100, may be formed of various materials which may serve the role. The buffer layer 101 is optional, and therefore may be omitted.

The compensation semiconductor layer A3, the compensation source electrode S3, and the compensation drain electrode D3 are disposed on the buffer layer 101.

Although not illustrated, in some embodiments, the driving semiconductor layer A1 of the driving thin film transistor T1 and the second emission control semiconductor layer A6 of the second emission control thin film transistor T6 may be formed on the buffer layer 101.

In some embodiments, the driving semiconductor layer A1 and the second emission control semiconductor layer A6 may be formed of polysilicon, and may respectively include a channel region which is not doped with impurities, and a source region and a drain region which are formed as impurities are doped into both sides of the channel region. Here, the impurities may vary with the type of a thin film transistor, and N-type impurities or P-type impurities may be used. Although not illustrated, the switching semiconductor layer A2 of the switching thin film transistor T2, the compensation semiconductor layer A3 of the compensation thin film transistor T3, the first initialization semiconductor layer A4 of the first initialization thin film transistor T4, the second initialization semiconductor layer A7 of the second initialization thin film transistor T7, the first emission control semiconductor layer A5 of the first emission control thin film transistor T5 may also be connected to the driving semiconductor layer A1 and the second emission control semiconductor layer A6 to be formed simultaneously.

The compensation semiconductor layer A3 includes the first semiconductor region A31 overlapping the first gate electrode G31, and the second semiconductor region A32 overlapping the second gate electrode G32.

In some embodiments, the length L31 of the first semiconductor region A31 is less than the length L32 of the second semiconductor region A32.

The compensation source electrode S3 corresponds to a compensation source region of the compensation semiconductor layer A3 which is doped with impurities, and is disposed adjacent to the second semiconductor region A32.

The compensation drain electrode D3 corresponds to a compensation drain region of the compensation semiconductor layer A3 which is doped with impurities, and is disposed adjacent to the first semiconductor region A31.

A first insulating layer 141 may be formed on the compensation semiconductor layer A3, the compensation source electrode S3, and the compensation drain electrode D3.

The compensation gate electrode G3 is formed on the first insulating layer 141. The compensation gate electrode G3 includes the first gate electrode G31 and the second gate electrode G32.

As described above, the first gate electrode G31 overlaps the first semiconductor region A31, and the second gate electrode G32 overlaps the second semiconductor region A32.

Although not illustrated, in some embodiments, the driving gate electrode G1, the switching gate electrode G2, the first scanning line 14, the second scanning line 24, the third scanning line 34, and the emission control line 15 may be disposed on the first insulating layer 141.

Also, in some embodiments, the second emission control gate electrode G6 of the second emission control thin film transistor T6 and the first electrode C1 of the storage capacitor Cst may be formed on the first insulating layer 141.

A second insulating layer 142 covers the first gate electrode G31 and the second gate electrode G32.

Although not illustrated, in some embodiments, the second electrode C2 of the storage capacitor Cst may be disposed on the second insulating layer 142.

In some embodiments, the second electrode C2 of the storage capacitor Cst includes an opening OP exposing a portion of the first electrode C1. Via the first contact hole 51 formed in the opening OP, the first electrode C1 may be connected to the compensation thin film transistor T3 and the first initialization thin film transistor T4.

In some embodiments, the storage capacitor Cst overlaps the driving thin film transistor T1. In more detail, the driving gate electrode G1 and the first electrode C1 are formed as one body, and thus the storage capacitor Cst and the driving thin film transistor T1 may be disposed to overlap, thereby securing enough storage capacity of the storage capacitor Cst.

An interlayer insulating layer 160 may be formed on the second insulating layer 142. In some embodiments, the interlayer insulating layer 160 may be formed on the second electrode C2 of the storage capacitor Cst and the initialization voltage line 22.

Although not illustrated, in some embodiments, the data line 16, the driving voltage line 26, and the initialization voltage line 22 may be disposed on the interlayer insulating layer 160.

The first conductive member CM1 is disposed on the interlayer insulating layer 160, and is connected to the compensation drain electrode D3 via the second contact hole 52. As shown in FIG. 3, the first conductive member CM1 is also connected to the driving gate electrode G1 of the driving thin film transistor T1 via the first contact hole 51.

Although not illustrated, in some embodiments, a protection film (not shown) or a planarization film (not shown) may be disposed on the first conductive member CM1, and a pixel electrode (not shown) of an organic-light emitting diode may be formed on the protection film (not shown) or the planarization film (not shown). The pixel electrode (not shown) is connected to the second conductive member CM2 exposed through the via hole VIA (Refer to FIG. 3), and the second conductive member CM2 is connected to the second emission control drain electrode D6 via the fifth contact hole 55. Thus, the pixel electrode (not shown) may be electrically connected to the second emission control drain electrode D6.

The other members will also be described in detail.

The data line 16 is connected to the switching source electrode S2 via the third contact hole 53. The first conductive member CM1 is connected to the first initialization source electrode S4 via the second contact hole 52.

The switching source electrode S2 and the first initialization source electrode S4 may be formed by respectively doping the switching semiconductor layer A2 and the first initialization semiconductor layer A4 with impurities.

The first initialization drain electrode D4 separated from the data line 16 may be disposed on the substrate 100.

Meanwhile, the organic light-emitting diode includes a pixel electrode, an intermediate layer, and an opposite electrode. The intermediate layer is disposed between the pixel electrode and the opposite electrode, and includes at least an emission layer so as to generate visible light. The emission layer may be formed by an organic material.

In some embodiments, the intermediate layer may include at least one selected from a hole injection layer, a hole transport layer, an electron transport layer, and an electron injection layer, along with the emission layer.

The pixel electrode may be an anode, and the opposite electrode may be a cathode. In the other way, the pixel electrode may be a cathode, and the opposite electrode may be an anode.

Meanwhile, the source electrodes and the drain electrodes of the above-described thin film transistors may be formed as the same layers as the corresponding semiconductor layers, respectively. That is, the source electrode and the drain electrode of each of the thin film transistors may be formed of polysilicon selectively doped with a doping material.

However, the present embodiment is not limited thereto. The source electrodes and the drain electrodes of the above-described thin film transistors may be formed as different layers from the corresponding semiconductor layers, respectively, and the source electrodes and the drain electrodes may be respectively connected to source regions and drain regions of the corresponding semiconductor layers via contact holes.

Figure 6:
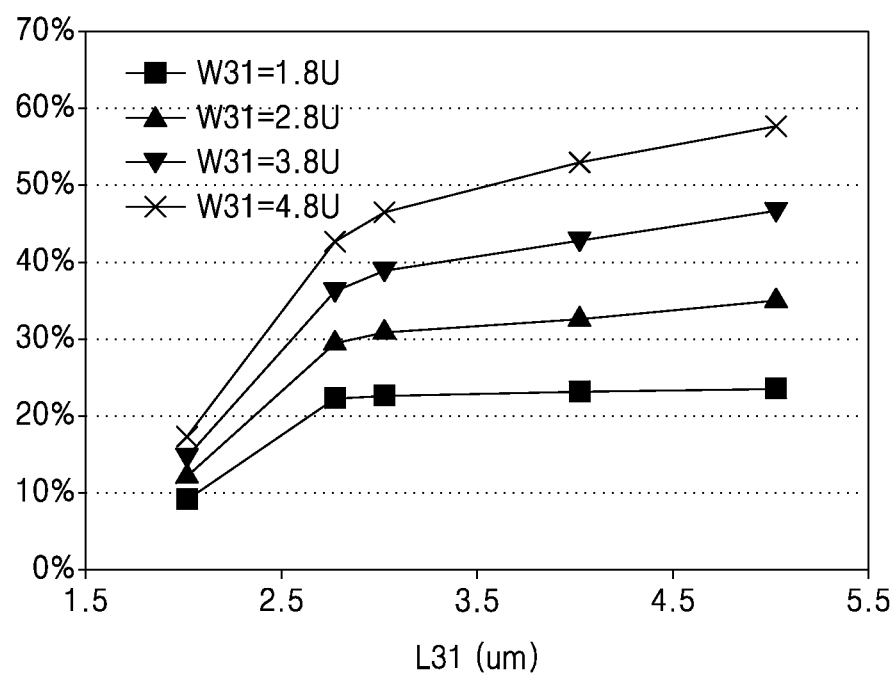
FIGS. 6 and 7 are graphs for describing a compensation thin film transistor included in the organic light-emitting display apparatus according to the present embodiment.
Figure 7:
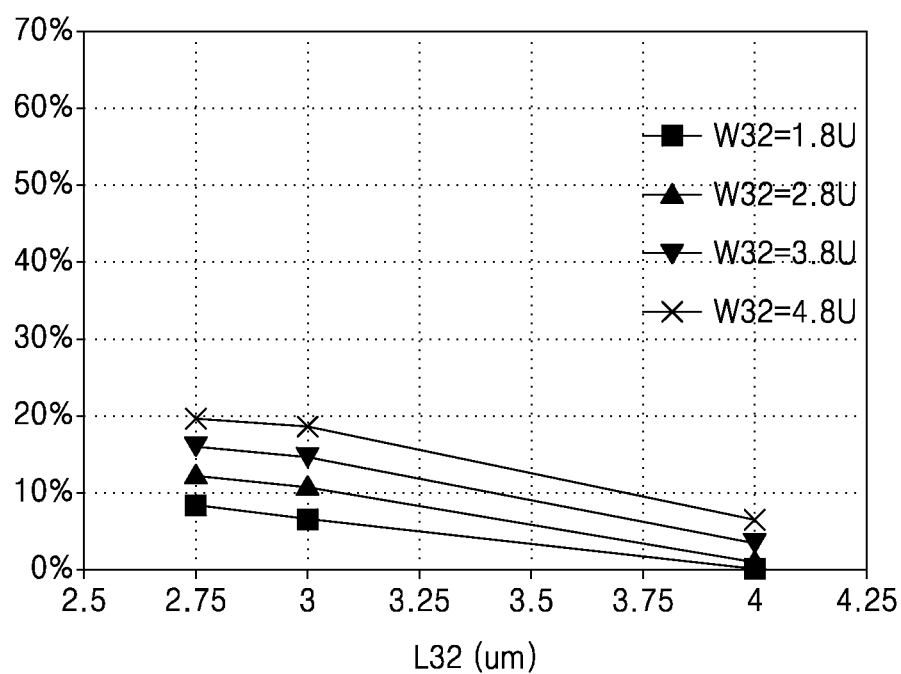

FIGS. 6 and 7 are graphs for describing the compensation thin film transistor T3 included in the organic light-emitting display apparatus 1000 according to the present embodiment.

FIG. 6 shows scattering of current by regions of the organic light-emitting display apparatus 1000 according to changes in the length L31 and the width W31 of the first semiconductor region A31 of the above-described compensation thin film transistor T3.

An x-axis of FIG. 6 denotes the length L31 of the first semiconductor region A31, that is, a region of the compensation semiconductor layer A3 which overlaps the first gate electrode G31 of the compensation gate electrode G3, and a y-axis of FIG. 6 denotes the scattering of current.

Referring to FIG. 6, four curves respectively corresponding to the cases that the width W31 of the first semiconductor region A31 is 1.8 μm, 2.8 μm, 3.8 μm, and 4.8 μm are illustrated.

The scattering of current decreases as the width W31 of the first semiconductor region A31 decreases. That is, the scattering of current is the least when the width W31 of the first semiconductor region A31 is 1.8 μm.

Also, regarding all of the four curves shown in FIG. 6, as the length L31 of the first semiconductor region A31 decreases, the scattering of current decreases.

That is, the scattering of current decreases as the width W31 and the length L31 of the first semiconductor region A31 of the compensation thin film transistor T3 decrease.

FIG. 7 shows scattering of current by regions of the organic light-emitting display apparatus 1000 according to changes in the length L32 and the width W32 of the second semiconductor region A32 of the above-described compensation thin film transistor T3.

An x-axis of FIG. 7 denotes the length L32 of the second semiconductor region A32, that is, a region of the compensation semiconductor layer A3 which overlaps the second gate electrode G32 of the compensation gate electrode G3, and a y-axis of FIG. 7 denotes the scattering of current.

Referring to FIG. 7, four curves respectively corresponding to the cases that the width W32 of the second semiconductor region A32 is 1.8 μm, 2.8 μm, 3.8 μm, and 4.8 μm are illustrated.

The scattering of current decreases as the width W32 of the second semiconductor region A32 decreases. That is, the scattering of current is the least when the width W32 of the second semiconductor region A32 is 1.8 μm. However, a change in the scattering of current according to the change in the width W32 of the second semiconductor region A32 is not as great as that in the scattering of current according to the change in the width W31 of the first semiconductor region A31.

Also, regarding all of the four curves shown in FIG. 7, as the length L32 of the second semiconductor region A32 increases, the scattering of current decreases.

That is, the scattering of current decreases as the length L32 of the second semiconductor region A32 of the compensation thin film transistor T3 increases. Also, as the width W32 of the second semiconductor region A32 decreases, the scattering of current decreases while the amount of decrease is relatively little compared to the first semiconductor region A31.

According to the present embodiment, the width W31 and the length L31 of the first semiconductor region A31 of the compensation thin film transistor T3 may be short such that scattering of current may be reduced, and the length L32 of the second semiconductor region A32 may be long such that the scattering of current may be reduced. The scattering of current by pixels in the whole region of the organic light-emitting display apparatus may be reduced, thereby configuring pixels having uniform image quality in different regions. In addition, errors such as spots may be easily reduced or removed.

That is, according to the present embodiment, an area of the first semiconductor region A31 of the compensation thin film transistor T3 may be less than that of the second semiconductor region A32, thereby improving image quality. If the area of the first semiconductor region A31 of the compensation thin film transistor T3 is too small, electrical operations of the compensation thin film transistor T3 may be abnormal. Therefore, the width W31 and the length L31 of the first semiconductor region A31 may be short such that the area of the first semiconductor region A31 may be less than the area of the second semiconductor region A32 and at the same time, scattering of current may be reduced within a range preventing abnormal electrical operations of the compensation thin film transistor T3.

As described above, according to one or more of the above exemplary embodiments, the organic light-emitting display apparatus may have image quality easy to improve.

While one or more exemplary embodiments have been described with reference to the appended figures, these are just examples and it will be understood by those of ordinary skill in the art that various changes in form and details may be made therein without departing from the spirit and scope of the inventive concept as defined by the following claims.

What is claimed is:

1. An organic light-emitting display apparatus, comprising:
    an organic light-emitting diode emitting visible light;
    a driving thin film transistor driving the organic light-emitting diode and comprising a driving gate electrode, a driving semiconductor layer, a driving source electrode, and a driving drain electrode; and
    a compensation thin film transistor electrically connected to the driving thin film transistor and compensating for threshold voltage of the driving thin film transistor,
    the compensation thin film transistor comprising a compensation gate electrode, a compensation semiconductor layer, a compensation source electrode, and a compensation drain electrode,
    the compensation gate electrode comprising a first gate electrode and a second gate electrode electrically connected to each other,
    the compensation drain electrode electrically connected to the driving gate electrode of the driving thin film transistor, and
    the compensation semiconductor layer comprising a first semiconductor region overlapping the first gate electrode and a second semiconductor region overlapping the second gate electrode and disposed further from the compensation drain electrode than the first semiconductor region, and an area of the first semiconductor region being less than that of the second semiconductor region.

2. The apparatus of claim 1, wherein a length of the first semiconductor region in a direction from the compensation source electrode to the compensation drain electrode is less than a length of the second semiconductor region in a direction from the compensation source electrode to the compensation drain electrode.

3. The apparatus of claim 1, wherein a width of the first semiconductor region in a direction perpendicular to a direction of the compensation source electrode toward the compensation drain electrode is less than a width of the second semiconductor region in a direction perpendicular to a direction of the compensation source electrode toward the compensation drain electrode.

4. The apparatus of claim 1, wherein the first gate electrode of the compensation gate electrode corresponds to a region of a wire, and the second gate electrode protrudes from the wire.

5. The apparatus of claim 1, wherein an area of the first gate electrode that overlaps the first semiconductor region and corresponds to a length in a direction from the compensation source electrode to the compensation drain electrode has a smaller width than an area of the second gate electrode that overlaps the second semiconductor region and corresponds to a length in a direction from the compensation source electrode to the compensation drain electrode.

6. The apparatus of claim 5, wherein a wire which the first gate electrode of the compensation gate electrode corresponds to is a scanning line via which a scan signal for driving the organic light-emitting diode is applied.

7. The apparatus of claim 6, further comprising a switching thin film transistor connected to the scanning line and comprising a switching gate electrode, a switching semiconductor layer, a switching source electrode, and a switching drain electrode.

8. The apparatus of claim 1, wherein the compensation semiconductor layer is curved such that the first semiconductor region and the second semiconductor region are not disposed side by side.

9. The apparatus of claim 1, further comprising a first conductive member electrically connecting the driving gate electrode and the compensation drain electrode,
wherein the first conductive member extends so as to be disposed in a first contact hole which corresponds to the driving gate electrode and in a second contact hole which corresponds to the compensation drain electrode.

10. The apparatus of claim 1, further comprising a storage capacitor which comprises a first electrode electrically connected to the compensation drain electrode and a second electrode connected to a driving voltage line.

11. The apparatus of claim 10, wherein the first electrode of the storage capacitor is connected to the driving gate electrode.

12. The apparatus of claim 10, wherein the second electrode comprises an opening formed in a region where the second electrode at least overlaps the first electrode.

13. The apparatus of claim 10, wherein the second electrode is at least commonly comprised in at least two adjacent pixels selected from among the pixels.

14. The apparatus of claim 10, wherein the driving voltage line is connected to the second electrode.

15. The apparatus of claim 1, wherein the compensation source electrode is electrically connected to the driving drain electrode.

16. The apparatus of claim 1, further comprising an emission control thin film transistor operating according to an emission control signal transmitted through an emission control line,
wherein the compensation source electrode is electrically connected to a pixel electrode of the organic light-emitting diode via the emission control thin film transistor.

17. The apparatus of claim 1, further comprising an emission control thin film transistor operating according to an emission control signal transmitted through an emission control line,
wherein the driving source electrode is electrically connected to a driving voltage line via the emission control thin film transistor.

18. The apparatus of claim 1, wherein the compensation source electrode and the compensation drain electrode are formed by doping the compensation semiconductor layer with impurities.

* * * * *